United States Patent [19]

Gloanec

[11] 4,242,597
[45] Dec. 30, 1980

[54] GUNN EFFECT SHIFT REGISTER

[75] Inventor: Maurice Gloanec, Paris, France

[73] Assignee: Thomson-CSF, Paris, France

[21] Appl. No.: 956,976

[22] Filed: Nov. 2, 1978

[30] Foreign Application Priority Data

Nov. 4, 1977 [FR] France ............... 77 33238

[51] Int. Cl.³ .................... H01L 27/26; G11C 19/28
[52] U.S. Cl. .................... 307/221 B; 365/169; 357/3
[58] Field of Search ............... 357/3; 307/206, 221 B, 307/252 E; 365/169

[56] References Cited
U.S. PATENT DOCUMENTS

| | | | |
|---|---|---|---|
| 3,365,583 | 1/1968 | Gunn | 357/3 |
| 3,535,601 | 10/1970 | Matsukura et al. | 357/3 |
| 3,621,306 | 11/1971 | Schickle | 357/3 |
| 3,659,158 | 4/1972 | Shoji | 357/3 |
| 3,691,481 | 9/1972 | Kataoka et al. | 357/3 |
| 3,766,372 | 10/1973 | Kataoka et al. | 357/3 |
| 3,836,989 | 9/1974 | Kataoka | 357/3 |
| 3,918,009 | 11/1975 | Claxton et al. | 357/3 |
| 4,047,199 | 9/1977 | Kataoka | 357/3 |

OTHER PUBLICATIONS

Mause, Electronics Letters, vol. 11, No. 17, pp. 408–409, Aug. 21, 1975.
Hartnagel, Gunn Effect Logic Devices, (American Elseview, Pub., N.Y., 1973), pp. 58, 103–105.

*Primary Examiner*—William D. Larkins
*Attorney, Agent, or Firm*—Oblon, Fisher, Spivak, McClelland & Maier

[57] ABSTRACT

A device derived from a bulk semiconductor component called "Gunn-effect triode"; utilizing the propagation of travelling domains between gate and anode of said triode. Forming a register element with such a device consists of a "writing arm" with a semiconductor band of Ga As organized into a Gunn-effect triode and a "reading arm" which is a similar band of Ga As having two electrodes instead of three i.e. an anode and a cathode. The two bands are connected by a bridge of Ga As. The travelling domain triggered by a digital signal is propagated by a lateral extension across the bridge from the writing arm to the reading arm. An n-bit register is carried out by arranging a series of register elements in such a manner that the gate of the first band of the first element forms the input terminal of the register and the cathode of the second band of the first element is connected to the gate of the first band of the second element and so on up to the second band of the $n^{th}$ element that is the output terminal of the register.

3 Claims, 3 Drawing Figures

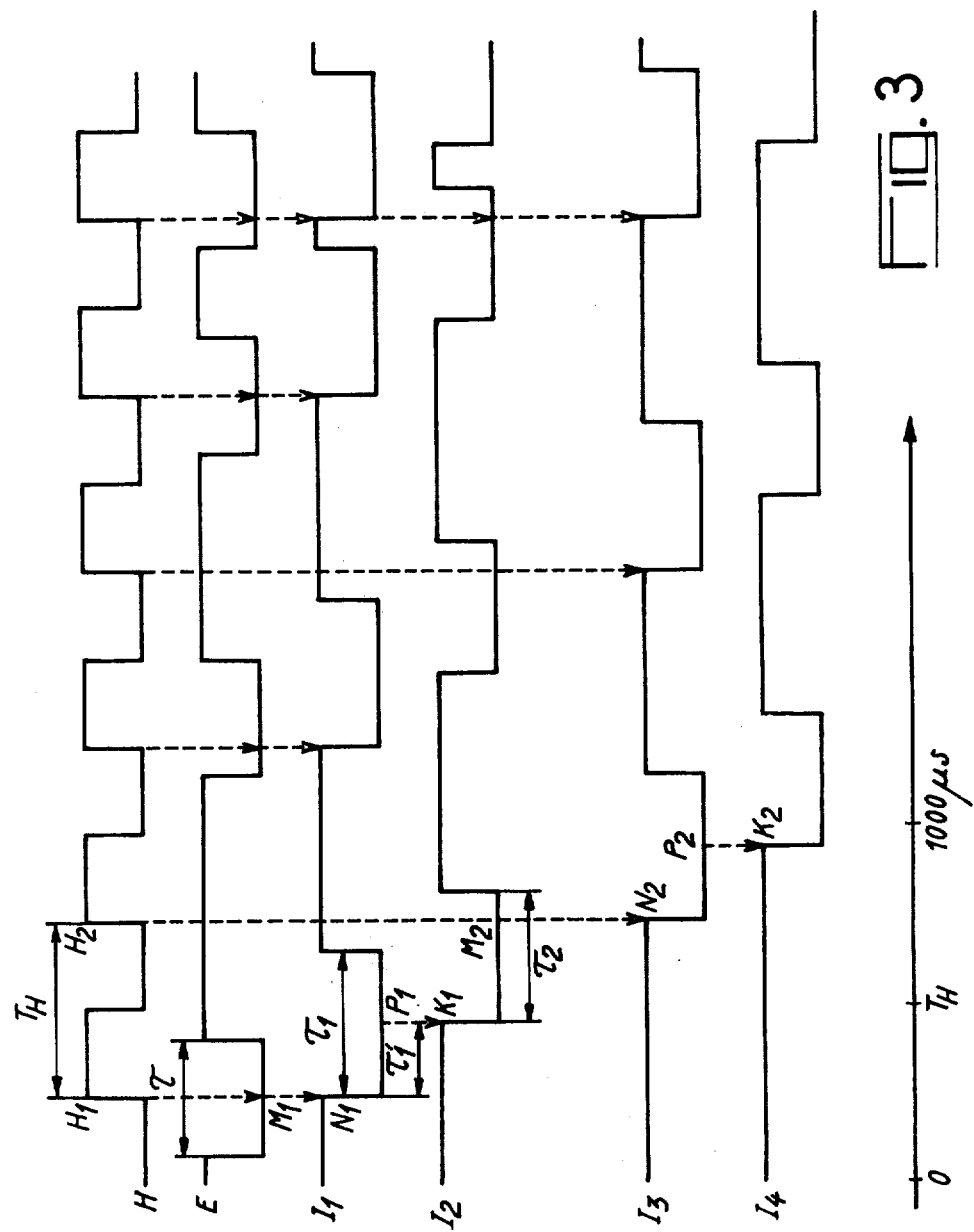

GUNN EFFECT SHIFT REGISTER

The invention relates to an element intended for a dynamic memory register utilising a device derived from a bulk semiconductor component called "Gunn-effect triode". The invention also relates to a shift register of n bits comprising a series of n elements of this type.

The Gunn-effect triode, a kind of bulk-effect differential negative resistance device, exhibits a semiconducting structure which has the appearance of a field-effect transistor on a semi-insulating substrate, in which the gate is arranged asymmetrically between the source and drain electrodes, the length of the actual conduction channel (below the gate) being much shorter than the distance separating the gate from the drain and the source (here termed the cathode) being much closer to the gate than the drain (here termed the anode). The suitably doped semiconductor material is selected to show the Gunn-effect oscillations, i.e. the phenomenon of travelling domain between cathode and anode when the electrical field in the material exceeds a critical value. This is the case with monocrystalline gallium arsenide, gallium antimonide Ga Sb or the alloy Ga In Sb, this list being by no means complete.

A travelling domain comprises a leading front of substantially zero density, which is comparable with a space charge zone, and a trailing front of high density which is called the accumulation zone.

In a Gunn-effect triode, the channel is traversed by a quiescent current in the anode-cathode direction in the absence of a pulse on the gate of the Schottky type, the conditions being such, particularly in regard to the potentials applied to the electrodes, that the electrical field in the semiconductor material is lower throughout than the critical field.

Providing certain additional requirements concerning the doping of the semiconductor material and the transit length and thickness of the channel are satisfied, it is possible to "trigger" the triode, i.e. to create below the gate a domain which will move towards the anode. In the case of N-doped gallium arsenide, the phenomenon is released by applying a negative voltage pulse to the gate which creates a space charge or which tends to increase an already existing space charge of low volume below the metallisation of the Schottky type gate. Since the flow of current is conservative, the effect of this action is to increase the electrical field in the material and to promote the creation of a dipolar region from a point where the electrical field will have exceeded the critical value.

If a series of clock pulses of suitable repetition frequency is applied to the gate, a series of negative current pulses between the cathode and anode will be collected at the anode, being equal in duration to the propagation time of the domain between the gate and the anode. This propagation time is of the order of 600 ps for a gate-anode distance of 50 microns in gallium arsenide. This pulse is distinguished by its rise and fall times which are well below 1 nanosecond. The nucleation time i.e. the production time of a domain is less than 100 ps and the vanishing time of a domain is substantially the same.

If a digital information comprising a certain number of "bits" constituted for example by negative pulses ("0" bits) and zero pulses ("1" bits) is applied to the gate, the Gunn-effect triode acts as a "dynamic memory point" because, during the propagation time T of the region between the gate and the anode, the information recorded in the form of a pulse of same duration is available at the output of the Gunn-effect triode by virtue of a known property of this device.

One could contemplate using such a storage device for forming a shift register: a pair of Gunn triodes would form one stage of such a register, the triodes of one and the same stage being controlled by the information signal and being triggered by clock signals staggered in time and applied to the respective anodes. The time stagger between two clock pulses would at most be equal to the length of the propagation time T of a domain. Since this time is less than 1 nanosecond, a register of the type in question would only be of interest in a very high frequency (>1 GHz) digital installation. However, at frequencies of this order, the transmission time from one triode to the next would no longer be negligible because, since the connection is capacitive or established by wire, i.e. reactive, this time can hardly fall below 100 picoseconds which is not negligible by comparison with a propagation time of a few hundred picoseconds.

The invention enables a register formed by a series of such elements to be produced whilst at the same time eliminating the limitation introduced by the connection between one Gunn triode and the next in regard to the transmission time.

According to the invention, there is provided a register element of the type comprising, on a semi-insulating substrate, a layer of semiconductor material having a differential mobility of charge carriers, and in said layer a first band forming a Gunn triode and accordingly comprising three electrodes, of which one is a starting electrode for a travelling domain and of which another forms a finishing electrode situated at a distance L from the starting electrode, said layer further comprising a second band parallel to the first comprising a first electrode intended to act as the finishing electrode for the travelling domain and a second electrode opposite in polarity to the first, the first and second bands being connected by a bridge of semiconductor material at a distance $L_1$ from the starting electrode of the first band and at a distance $L_2$ from the finishing electrode of the second band, the lengths L, $L_1$ and $L_2$ satisfying the relation:

$$L_1+L_2>L$$

The invention will be better understood and other features thereof will become apparent from the following description considered in conjunction with the accompanying drawings, wherein:

FIG. 3 is a diagram illustrating mode of operation.

Figure 1:
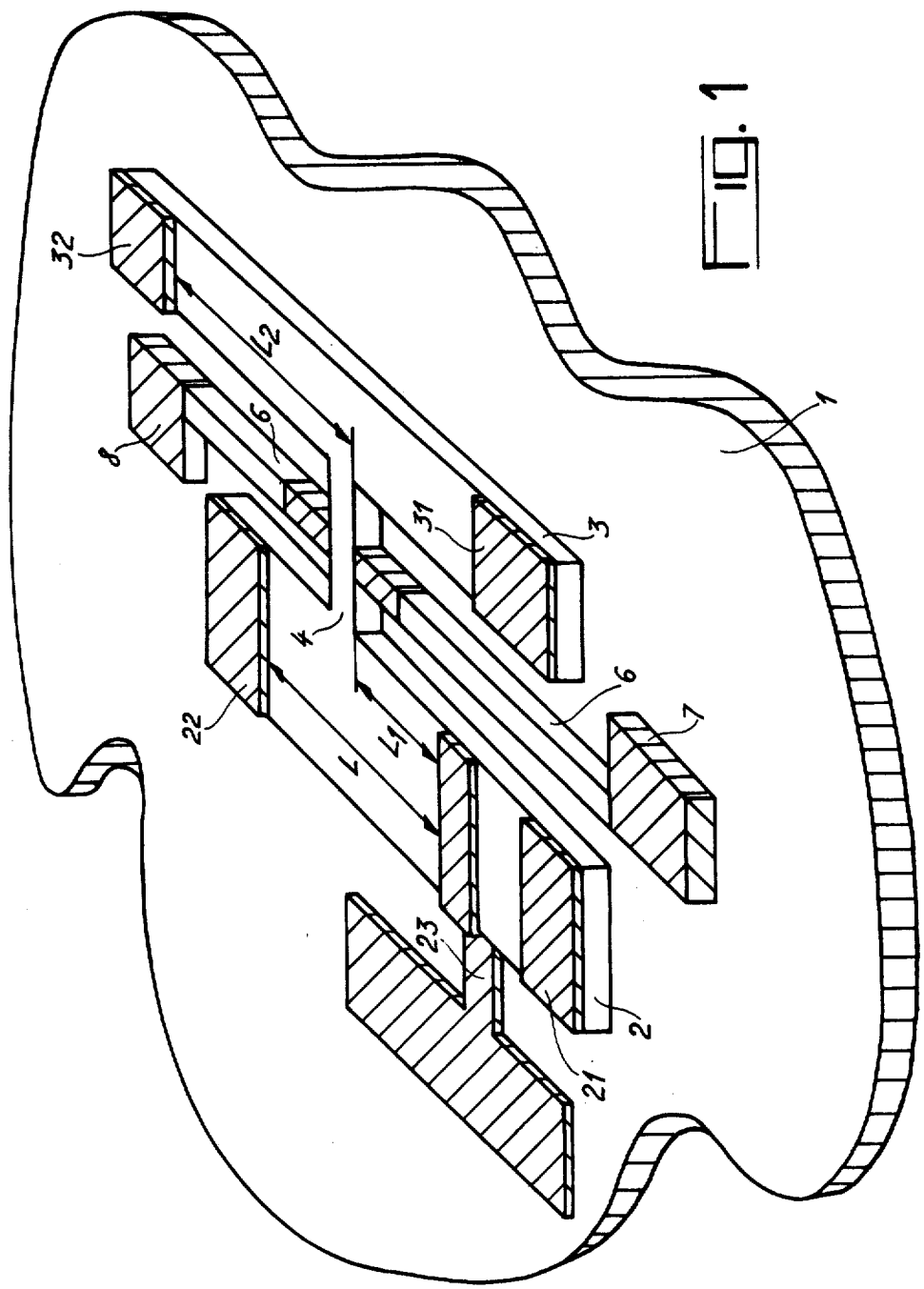
FIG. 1 is a perspective view of part of a semiconductor substrate comprising a register element according to the invention.

FIG. 1 shows part of a wafer 1, for example of monocrystalline gallium arsenide. A register element according to the invention has been formed on this part of the wafer. A series of similar elements for example may be formed on the rest of the wafer, as is standard practice in integrated circuit technology. The metallisations deposited on the wafer to form the feeders and the connections to other elements have not been shown.

Two parallel bands 2 and 3 joined by a bridge 4 have been formed by epitaxy, followed by photoetching, being integral parts of one and the same layer of N-doped monocrystalline gallium arsenide having a thickness $a_o$, i.e. for example 2 microns. The concentration $n_o$ of donor atoms is for example from $10^{15}$ to $10^{16}$ atoms per cubic centimetre. The value of the parameters $a_o$ and $n_o$ are such that, in the case of gallium arsenide, $$a_o n_o > 10^{11} \text{ cm}^{-2}.$$

In the example selected, ohmic contacts 21 (cathode), 22 (anode), 31 (cathode) and 32 (anode) have been conventionnally formed at the ends of the bands 2 and 3. A gate 23 is formed by a deposit of metal in the form of a Schottky gate. The anodes could also be Schottky contacts. Finally, metallic contacts 7 and 8 and bars 6 of gallium arsenide of fairly high resistivity have been formed on either side of the bridge 4 during the same process as the semiconducting bands and the various metallic deposits.

The semiconductor bridge is designed to give rise to the phenomenon of transverse extension of the travelling domain when it arrives at the level of the bridge. The thickness of the layer is the same in the bands 2 and 3 and in the bridge 4. During its extension from the band 2 to the band 3, the Gunn domain has to find a passage provided by the bridge which has to be wide enough substantially to accommodate the space charge zone and the accumulation zone characteristic of the Gunn domain. The width of the passage has to be of the order of 6 times the so-called Debye length. Finally, the length of the channel has to be short enough for the extension time to be negligible by comparison with the propagation time in a band, i.e. for example of the order of a few microns (it is known that the lateral extension velocity is of the order of 10 times the propagation velocity of the domain in the longitudinal direction).

In order to explain the elementary operation of a dynamic memory point i.e. a Gunn-effect triode, it is convenient to recall the two requirements which have to be satisfied for a Gunn domain to be created beneath the gate 23:

(1) the anode has to be at a potential which exceeds a certain threshold, i.e. $V_S$;

(2) the gate has to be at the "negative" potential (in this case zero).

When the signal, which is assumed to be in the form of negative pulses, is present at the gate, "writing" will only take place in the band 2 (writing branch of the register element) if a negative pulse is present at the gate 23 and, at the same time, a positive clock pulse is applied, causing the anode to cross the potential threshold $V_S$. The Gunn domain present in the band 2 travels through this band until it arrives at the bridge 4. At this instant, the information contained in the negative pulse recorded in the band 2 and dynamically memorized in the band 3 during the propagation of the Gunn domain up to the anode 32 will be "read" by virtue of the transverse extension of the domain to the band 3.

Figure 2:
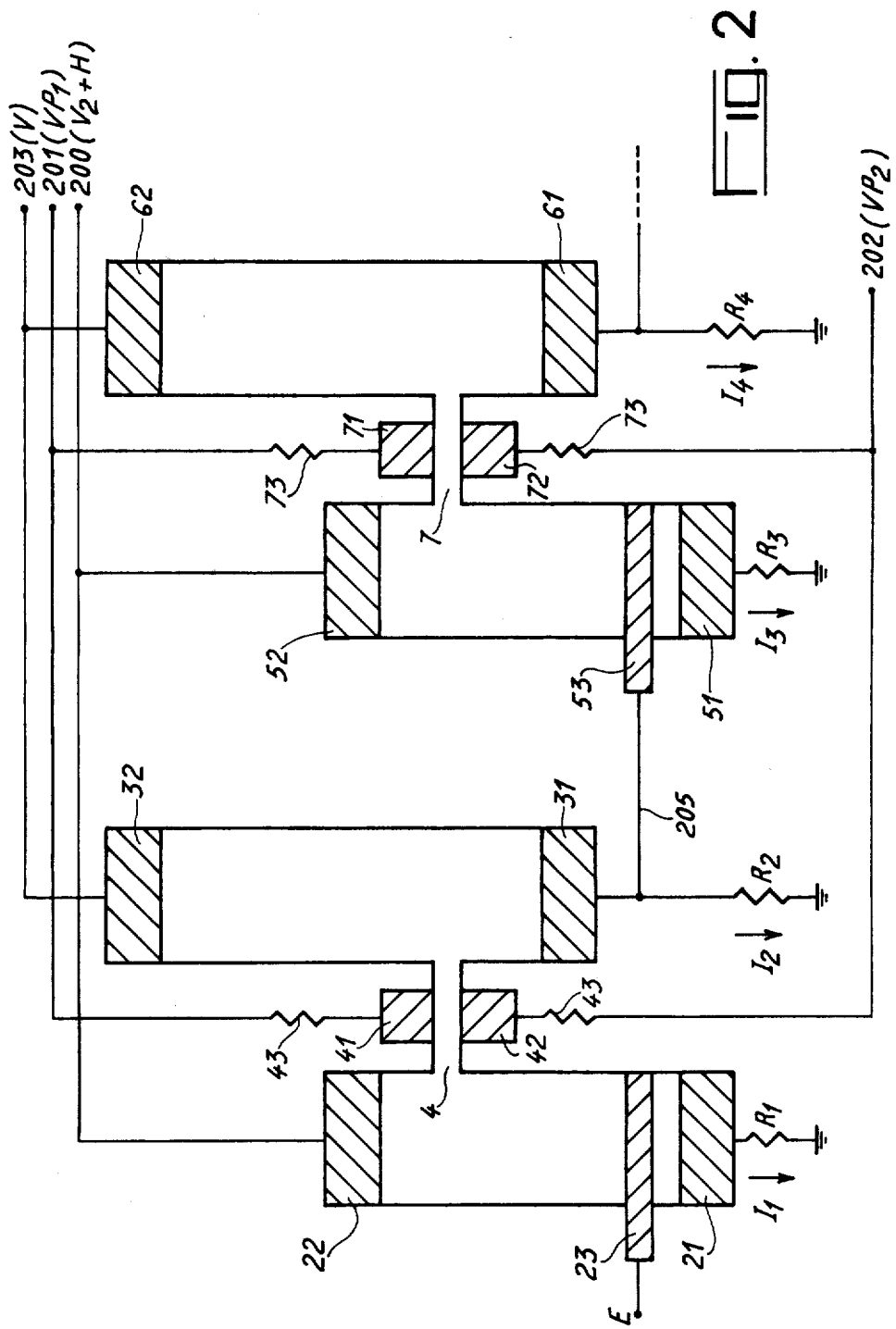
FIG. 2 is an electrical diagram of a register comprising two register elements according to the invention.

FIG. 2 diagrammatically illustrates a two-bit shift register, each bit comprising a register element of the type illustrated in FIG. 1, a direct connection directly connecting one register element to the following element. Accordingly, the shift register shown in FIG. 2 comprises:

a first writing arm (cathode 21, gate 23, anode 22), the gate 23 forming the input of the register;

a first reading arm (cathode 31, anode 32), connected to the writing arm by a bridge 4 surrounded by electrodes 41 and 42;

a second writing arm (cathode 51, gate 53, anode 52);

a second reading arm (cathode 61, anode 62) connected to the corresponding writing branch by a bridge 7 surrounded by electrodes 71 and 72.

Feed voltages are applied under the following conditions:

to the anodes 22 and 52 by a connection 200: a d.c. voltage $V_2$ upon which a series H of positive clock pulses is superimposed (see graph in FIG. 3);

to the anodes 32 and 62 by a connection 203: a d.c. voltage V which is sufficient to establish and propagate the Gunn domain collected by transverse extension of the domain propagated on the writing arm;

to the electrodes 41 and 71: a d.c. voltage $VP_1$ through resistors 43 and 73 (connection 201);

to the electrodes 42 and 72 through resistors 43 and 73, respectively, a voltage $VP_2$ (connection 202).

The voltages $VP_1$ and $VP_2$ and the values of the resistors 43 and 73 determine the value of the field for providing the transverse extension.

Load resistors $R_1$, $R_2$, $R_3$ and $R_4$ are disposed between the respective cathodes of the writing and reading arms on the one hand and ground on the other hand. These resistors may be formed either by discrete components or, like the resistors 43 and 73, by portions of semiconductor deposits suitably doped and/or dimensioned. In the latter case, it is possible by acting on the technological parameters to ensure that no travelling domain of the Gunn type is capable of being created.

Finally, there is a connection 205 connecting the cathode 31 to the gate 53. More generally, for an N-stage register, the cathode of the second arm of each stage is connected to the gate of the first arm of the following stage, except for the last stage where the cathode of the second arm forms the output terminal of the register.

The mode of operation of the register is illustrated in the diagram shown in FIG. 3. In this diagram, the abscissae are recorded parallel to a time scale Ot on which the abscissa point 1000 picoseconds has been marked. For each value ($I_1$, $I_2$, $I_3$, $I_4$) or signal (H, E), the ordinates are shown independently of their origins (not shown): these are potentials for the clock pulses (positive pulses of potential H and repetition frequency $T_H$) and intensities for the cathode-anode currents in the four arms, these currents re-appearing in the resistors $R_1$ to $R_4$ between cathode and ground.

A clock frequency of 1.56 GHz, whence $T_H$ = approximately 640 ps, has been selected by way of example in the following, the pulses lasting 320 ps and being separated by an interval of the same duration. It can readily be seen that, to obtain correct operation of the register, it is necessary to have:

a propagation time between the gate 23 and the anode 22, i.e. $\tau_1$ for the pulses $I_1$ ($\tau_3$ for the pulses $I_3$) such that:

$$\tau_1 \text{ (or } \tau_3) < T_H \tag{1}$$

a total propagation time from the gate 23 or 53 to the anode 32 (or 62) such that, if $\tau'_1$ is the propagation time between the gate and the bridge and $\tau'_2$ is the propagation time between the bridge and the anode of the reading arm, then:

$$\tau'_1 + \tau_2 > T_H \tag{2}$$

a propagation time $\tau_2$ such that the reading arm is at rest before another domain appears at the level of the bridge; it can easily be seen that this condition is:

$$\tau_2 < T_H \quad (3)$$

It can easily be seen that, with $\tau_1$ and H selected, it is of advantage to select $\tau_2$ to be greater than $\tau_1$ whilst remaining smaller than $T_H$ if all the above requirements are to be satisfied.

In the example illustrated in FIG. 1, with gallium arsenide in a layer thickness of 2 microns and doped in a concentration of $10^{\neq}$donor atoms per cubic centimeter, the longitudinal propagation velocity of a domain being $10^7$ cm/s, the dimensions $L_1$, L and $L_2$ would be 22 microns, 35 microns and 47 microns, respectively, for a clock frequency of 1.56 GHz ($T_H = 640$ ps).

The bridge 4 offers a section of $2 \times 6$ microns to the interference in transit; its length is 10 microns.

The transit times of the Gunn domains are thus:
$\tau'_1 = 220$ ps
$\tau_1 = 350$ ps
$\tau_2 = 470$ ps.

It can be seen that the diagram of FIG. 3 contains return lines which mark certain coincidences, namely:

(1) a line $H_1M_1N_1$ showing that a bit is recorded in the simultaneous presence of a clock pulse (starting at the point $H_1$) and a negative signal pulse E (point $M_1$), whence a negative pulse of $I_1$ starting at $N_1$;

(2) a line $P_1K_1$ showing that the bit recorded in the first instance is read in the event of movement of the domain (point $P_1$) at the end of an interval $\tau'_1$, whence a negative pulse of $I_2$;

(3) a line $H_2M_2N_2$ similar to the line $H_1M_1N_1$ for the second register stage, the input signal of this second register stage coming from the cathode 31 via the connection 205, i.e. the negative pulse recorded in the current $I_2$;

(4) a line $P_2K_2$ similar to the line $P_1K_1$.

In a variant of the register described and illustrated, it would be possible to form not one but two independent trigger gates (similar to 23 and 53) facing one another at the same distance from the cathode; one of them would be controlled by the signal E, as described above; the other gate would be controlled by a clock pulse. The signal would be recorded if the two control pulses were present at the same time.

Advantages of the invention which have not yet been mentioned include:

the compactness of the structures on one and the same wafer of semiconductor material at the rate of one device per register stage;

speed of performance (gigahertz range);

the simplicity of the control process.

What I claim is:

1. A dynamic memory register of the type utilizing the traveling of Gunn domains in a semiconductor material, comprising:

a substrate of semi-insulating material;

a layer of semiconductor material disposed on said substrate and having a differential mobility of charge carriers;

said semiconductor material being organized in a succession of register elements from 1 to n, with n being an integer greater than 1, together constituting an n-bit shift register;

each of said elements comprising a first and a second band connected by a bridge of the same semiconductor material;

said first band being organized in a Gunn-effect triode with a first starting electrode, a gate and a first finishing electrode, a distance L separating the first gate and the first finishing electrode;

said second band being substantially parallel to said first band, having a second starting electrode and a second finishing electrode and being connected to said first band by said bridge at a distance $L_1$ from said first gate and at a distance $L_2$ from said second finishing electrode, the lengths L, $L_1$ and $L_2$ satisfying the relationship $$L_1 + L_2 > L$$

said gate of each register element forming the input terminal of said register element;

said second starting electrode of each register element being connected to said gate of the following register element;

and said second starting electrode of the $n^{th}$ register element being the output terminal of said n-bit shift register.

2. A register as claimed in claim 1, wherein means are provided to supply:

said first finishing electrodes with a d.c. voltage and, superimposed to said voltage, clock pulses;

said second finishing electrodes with a d.c. voltage.

3. A register as claimed in claim 2, wherein supplementary electrodes are arranged on the sides of each bridge connecting said first and second band and means are provided to supply a d.c. voltage between said supplementary electrodes.

* * * * *